United States Patent
Haider et al.

(10) Patent No.: US 7,327,140 B2
(45) Date of Patent: Feb. 5, 2008

(54) MAGNETIC RESONANCE SYSTEM AND METHOD FOR CHECKING THE POSITIONING OF AN EXAMINATION SUBJECT

(75) Inventors: Sultan Haider, Erlangen (DE); Peter Kreisler, Buckenhof (DE)

(73) Assignee: Siemens Aktiengesellschaft, Munich (DE)

( * ) Notice: Subject to any disclaimer, the term of this patent is extended or adjusted under 35 U.S.C. 154(b) by 133 days.

(21) Appl. No.: 11/296,837

(22) Filed: Dec. 7, 2005

(65) Prior Publication Data

US 2006/0183997 A1    Aug. 17, 2006

(30) Foreign Application Priority Data

Dec. 7, 2004    (DE) .................. 10 2004 058 943

(51) Int. Cl.
*G01V 3/00* (2006.01)
(52) U.S. Cl. .................. 324/307; 324/309; 324/318
(58) Field of Classification Search ........ 324/300–322; 600/410–435
See application file for complete search history.

(56) References Cited

U.S. PATENT DOCUMENTS

| | | |
|---|---|---|
| 6,611,702 B2 | 8/2003 | Rohling et al. |
| 2002/0042566 A1 | 4/2002 | Matsuzaki et al. |
| 2003/0144589 A1 | 7/2003 | Roell |
| 2005/0265516 A1 | 12/2005 | Haider |

OTHER PUBLICATIONS

"Sicherheitsaspekte zur Vermeidung Strominduzierter Hautverbrennungen in der MRT," Knopp et al, Radiologe, vol. 38, (1998) pp. 759-763.

*Primary Examiner*—Diego Gutierrez
*Assistant Examiner*—Dixomara Vargas
(74) *Attorney, Agent, or Firm*—Schiff Hardin LLP

(57) ABSTRACT

In a magnetic resonance system and method for checking the positioning of an examination subject, with an image acquisition unit that acquires images of an examination subject by means of nuclear magnetic resonance, an image processing unit automatically searches the acquired images of the examination subject for geometric figures in the examination subject that could result in closed current loops in the examination subject, and an information unit automatically informs operating personnel of the magnetic resonance system when the image processing unit has detected a geometric figure that could lead to closed current loops in the acquired images.

17 Claims, 3 Drawing Sheets

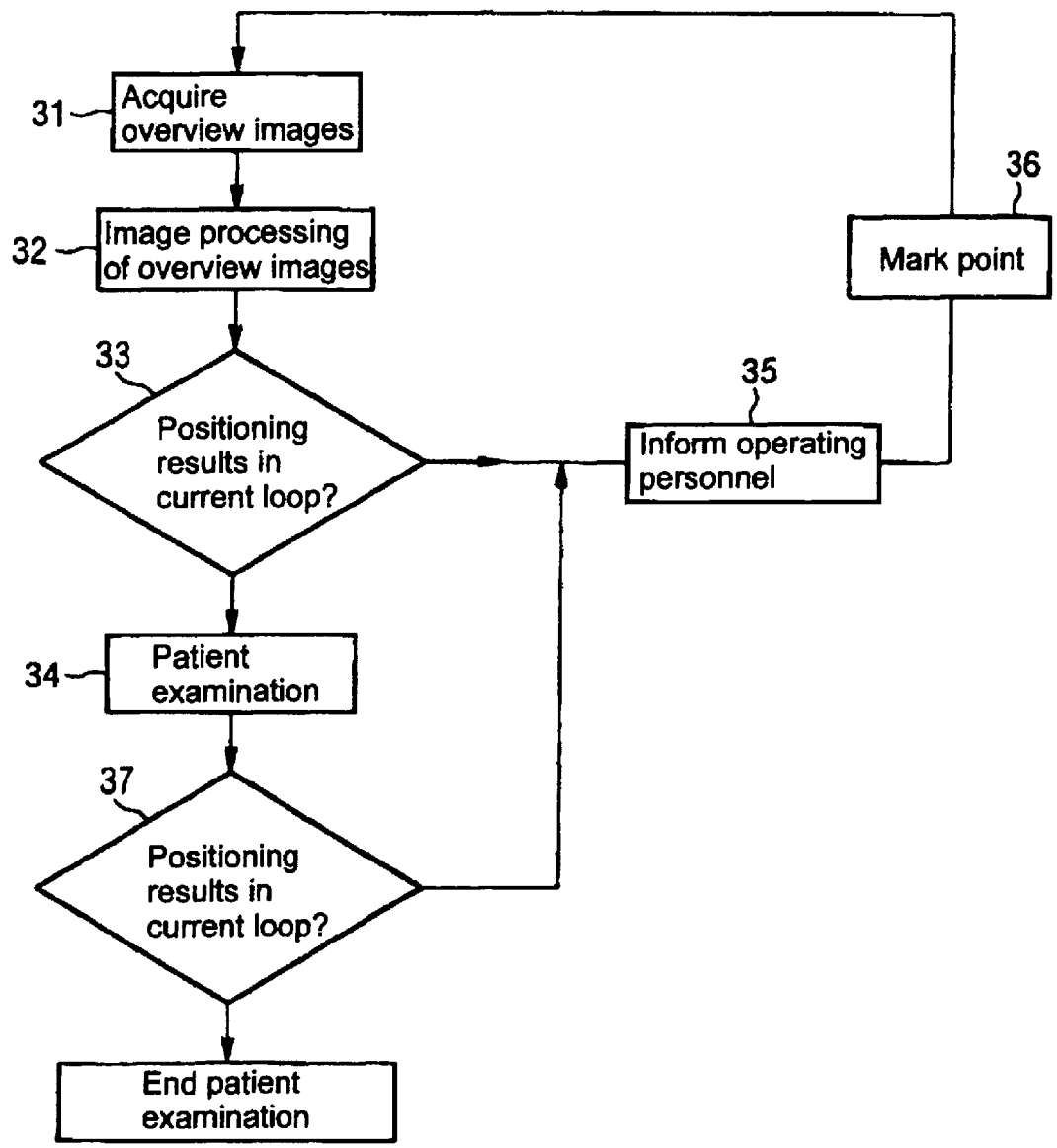

MAGNETIC RESONANCE SYSTEM AND METHOD FOR CHECKING THE POSITIONING OF AN EXAMINATION SUBJECT

BACKGROUND OF THE INVENTION

1. Field of the Invention

The present invention concerns a method for checking the positioning of an examination subject in a magnetic resonance system and a magnetic resonance system for implementing such a method. The invention in particular concerns a method for checking the positioning and a magnetic resonance system to achieve increased patient safety, by preventing possible injury to the patient by the formation of closed current loops in the patient due to the switching of magnetic field gradients.

2. Description of the Prior Art

Examinations using magnetic resonance tomography are used for various medical inquiries. Shorter examination times are always desired, not only for cost reasons but also in order to be able to obtain images of moving organs. For acquisition of MR images, radio-frequency pulses are used in connected with magnetic gradient fields that are switched on and off with very short switching times in order to shorten the acquisition time of an MR image as well as for contrast optimization.

Patient safety, however, must simultaneously be ensured. When radio-frequency pulses that are radiated into the body, a disadvantageous positioning of the examination subject (i.e. the patient) can cause the problem of closed current loops arising, that are induced in the body of the examination subject by the temporally varying magnetic flux. The induced voltage, and with it the current induced in the body, increase as the temporal change (rate of change) of the magnetic flux increases. The induced voltage and current also are dependent on the shape, position and size of the possible current loops. In the positioning of a patient before an MR examination, attention consequently must be paid to ensure that the positioning of the patient does not result in any geometric configurations that could lead to closed current loops. Among other things, such loops can result when the extremities contact one another or when a body extremity contacts another region of the body. It is consequently the task of the operating personnel of magnetic resonance systems to monitor the positioning of patients and to ensure that such closed current loops are prevented.

Closed current loops that can lead to burns on the examined patient do not always occur when the positioning of the patient is such that a current loop could form. Nevertheless, for the patient safety it must be ensured that the precondition for the formation of such current loops does not exist during the MR examination. Furthermore, recently new techniques have made it possible to acquire whole-body exposures by nuclear magnetic resonance. This is achieved, among other things, by the patient bed either being continuously moved with the patient thereupon, or shifted in steps through the magnetic resonance system, whereby respective MR images of the body part temporally located in the magnet are acquired and these are subsequently assembled.

SUMMARY OF THE INVENTION

An object of the present invention is to increase patient safety and, in a simple manner, to detect and to prevent the formation of closed current loops in the positioning of the patient in a magnetic resonance apparatus.

This object is achieved in accordance with the invention, by a magnetic resonance system having an image acquisition unit that acquires images of an examination subject by means of nuclear magnetic resonance, an image processing unit that searches the acquired images of the examination subject for geometric figures in the examination subject that could result in closed current loops in the examination subject, and an information unit is connected to the image processing unit and, controlled by the search result, informs operating personnel of the magnetic resonance system if the image processing unit has detected a geometric figure in the acquired images that could lead to closed current loops. As noted above, with new acquisition techniques it has become possible to acquire overview exposures that cover a larger part of the examination subject, which was not possible with conventional MR techniques since the image acquisition region (field of view) was previously limited to a partial region. The acquired MR images could only be used in a limited manner to detect current loops. According to the invention it is now possible to be able to detect the MR images that occupy a large region of the body of the examination subject, by using the MR images and examining them for geometric shapes that could result in closed current loops. In particular when the patient is covered with cloths or with receiver coils, it is not simple for the operating personnel of the magnetic resonance system to visually monitor the positioning of the patient such that current loops are prevented. The acquired MR image now is inventively used to detect such current loops.

According to a preferred embodiment of the invention, the MR system has a databank with reference images of an examination subject, the reference images exhibiting various positionings of an examination subject that could result in closed current loops in the examination subject. The image processing unit compares the acquired images with the reference images. Simple forming of closed current loops such as, for example, due to the contact of both lower legs or the contacting of the body by the arms, can be represented in the reference images, so that such positionings can be detected by comparison of the acquired MR images with the reference images.

In another preferred embodiment, the image acquisition unit acquires composite images of an overview image of the body of the examination subject (the patient) including the extremities, with the examination subject either being moved through the magnetic resonance system in steps or continuously, if the examination subject cannot be completely imaged with one acquisition of an MR image. The extremities (such as arms and legs) preferably are completely acquired since most probably closed current loops can result due to various arm or leg positionings.

Magnetic gradient fields in connection with RF pulses are also used in the overview exposures for spatial coding. RF pulses with a larger temporal interval therebetween preferably are used in the imaging sequences for generation of overview images. A danger to patient safety theoretically can always result when RF pulses are switched on and off in very short time periods and when the patient is simultaneously positioned such that the current loops enclose a large area. Before such imaging sequences are used in the patient examination, by acquisition of an overview image it can be assured that no geometries exist that could lead to closed current loops.

Furthermore, the information unit can be or can include a laser pointer device or other light pointer that automatically marks the position on the examination subject at which a closed current loop could result by contact of two different body parts of the examination subject. The operating personnel of the magnetic resonance system thus are immediately made aware of the critical position and can reposition the examination subject as needed.

The above object also is achieved in accordance with the invention by a method for checking the positioning of an examination subject in a magnetic resonance system including the steps of acquiring: at least one image of the examination subject is by means of nuclear magnetic resonance, automatically electronically searching the acquired magnetic resonance image for geometric figures in the examination subject that could result in closed current loops in the examination subject and, if a geometric figure is detected in the acquired magnetic resonance image, automatically informing operating personnel of the magnetic resonance system. This can occur, for example, by a notification that the current positioning could lead to current loops is displayed on the screen of the operating personnel. For this purpose an image processing unit is used to search the acquired image of the examination subject for geometric figures that could result in closed current loops in the examination subject.

Furthermore, in the search for geometric figures the acquired image can be compared with reference images of a databank, the reference images exhibiting various positionings of an examination subject that could result in closed current loops in the present examination subject.

It is likewise possible to search in the acquired MR images for free areas that are enclosed by the body of the examination subject or the various body parts of the examination subject, in particular the extremities.

In order to be able to make the best possible prediction as to whether current loops could result in the body of the examination subject, composite images forming an overview image of the body inclusive of all extremities are preferably acquired. As previously mentioned, the examination subject can be shifted for this purpose either in steps or continuously through the magnetic resonance system.

According to a preferred embodiment, the search assumes a closed current loop in the examination subject can result when the extremities of the body mutually contact (for example one foot touches the other, one arm touches the other arm, one arm touches one leg or another region of the body). Furthermore, the search indicates a closed current loop is detected when the an extremity of the body contacts another region of the body, for example an arm touching the head or the upper body.

In order to further increase patient safety, a closed current loop is not only identified when the search detects contacting of various body parts, but also a warning is output to the operating personnel when the various regions of the body approach one another up to a predetermined separation, for example more than 1 cm. A different minimum separation naturally can be selected.

Images with transversal, coronary or sagittal slice planes can be formed for testing of the MR images for closed current loops. These images can subsequently be examined for the geometric figures that could result in closed current loops in the examination subject. Furthermore it is possible to form volume data sets from the acquired image data, such that inclined slice planes also can be examined for the formation of current loops.

In a further preferred embodiment, the images acquired during the actual MR examination are automatically electronically for geometric figures that could result in closed current loops in the examination subject. Movement of the examination subject in the course of the examination thus can be monitored. MR examinations can extend over multiple minutes up to a quarter of or half an hour or even longer, such that movement of the body cannot be precluded. Should the examination subject change his or her positioning such that current loops could occur during the actual MR examination, in this case the operating personnel are informed when such a current loop is detected in the images.

DESCRIPTION OF THE DRAWINGS

FIG. 3 is a flowchart for operation of an MR system according to the present invention.

DESCRIPTION OF THE PREFERRED EMBODIMENTS

Figure 1:
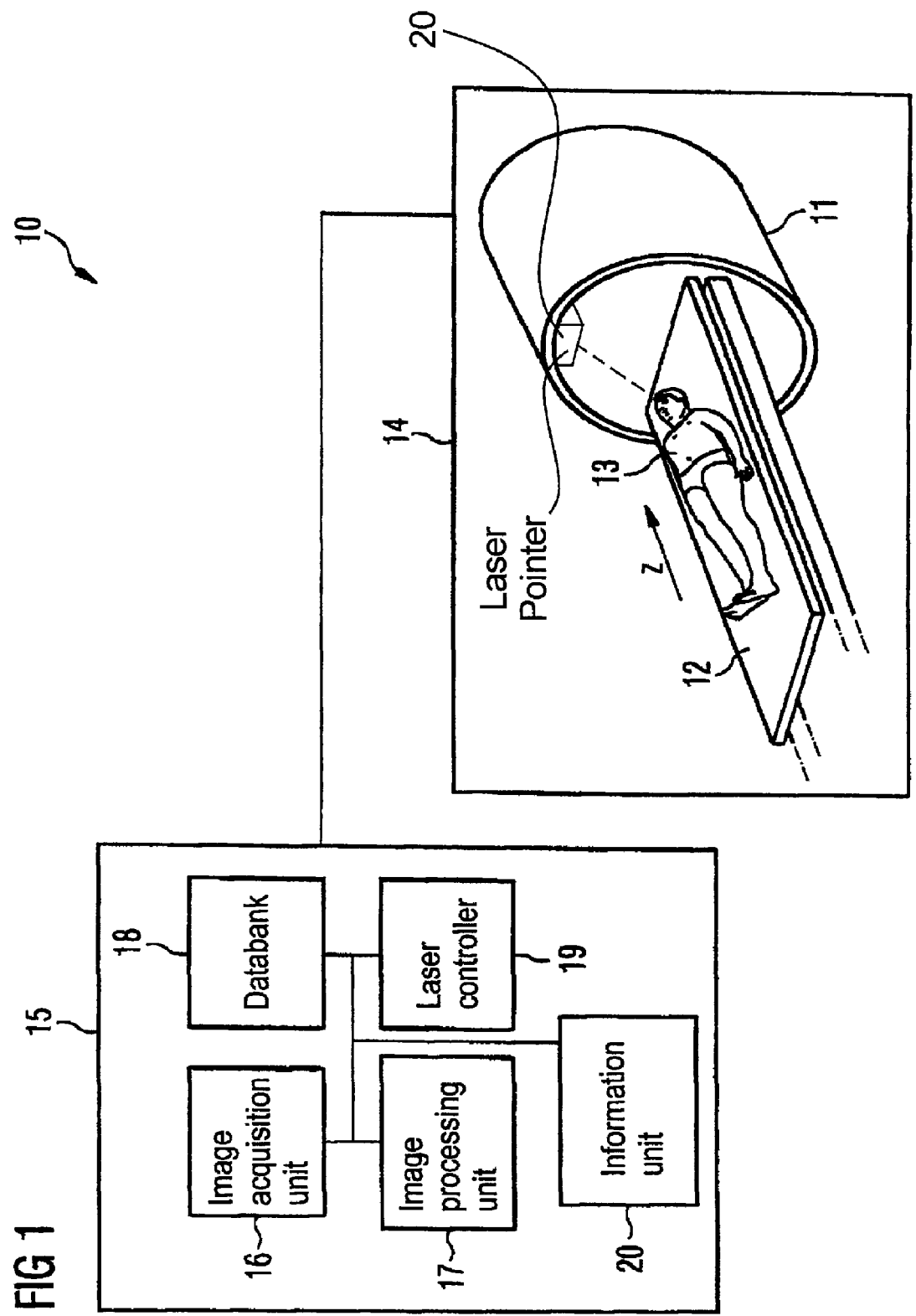
FIG. 1 is a schematic illustration of an inventive MR system.

A magnetic resonance system with which possible current loops can be detected in the patient positioning is schematically shown in FIG. 1. The magnetic resonance system 10 shown in FIG. 1 has a magnet 11 for generation of the basic magnetic field in which an examination subject (here a patient 13) on a patient bed 12 can be inserted. The patient bed 12 can be displaced in the z-direction. The magnet 11 with the patient bed 12 and the patient 13 typically are arranged in a shielded compartment 14. To operate the magnetic resonance system a control unit 15 is provided that is connected with the components in the compartment 14. The control unit 15 has an image acquisition unit 16 that controls the manner by which MR images of the patient 13 are acquired, i.e. how the gradients and the RF pulses are switched for excitation of the spins. Furthermore, an image processing unit 17 is provided that generates or reconstructs MR images from the data acquired by the image acquisition unit 16 and then automatically searches the MR images for geometric figures that could result in closed current loops in the body of the patient 13. In the search for closed current loops, for example, a databank 18 can be accessed that contains reference images that contain the various positionings of patients that could lead to closed current loops. Naturally, the image processing unit 17 can also use other image processing methods in order to detect closed current loops in the images. For example, the image processing unit 17 can search for free areas that are completely surrounded by a region of the body of the patient. Furthermore, the contour of the body can be tracked and examined as to whether it contacts another part of the body. Image processing methods of this type are known to those skilled in the art and consequently need not be explained in detail herein.

For a reliable detection of current loops it is necessary for the body to be completely imaged with all extremities. For this the patient bed 12 can be shifted either continuously or in steps in the z-direction through the magnet 11. The resulting MR images are subsequently assembled into a complete image of the patient and then can be examined for possible current loops. If a closed current loop is detected by the image processing unit 17, a laser controller 19 can activate a laser pointer 20 such that the position at which the current loop would close due to contact of various body parts is marked on the body of the patient. An information unit 20, for example a display unit, informs the operating personnel about the detected possible current loops.

Figure 2:
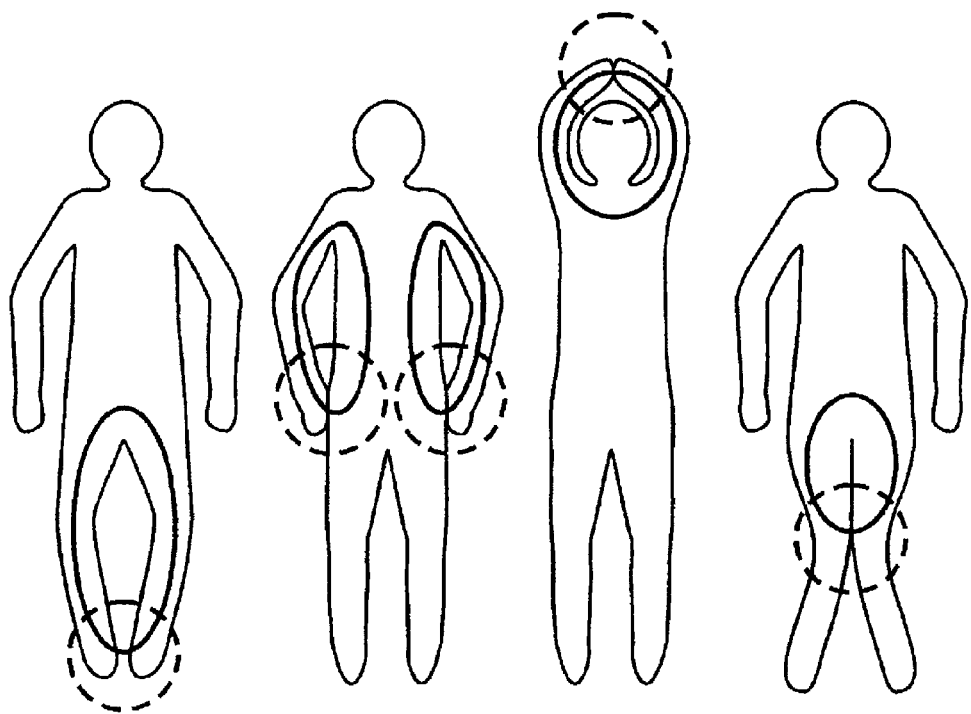
FIG. 2 shows examples of geometric figures that could lead to closed current loops in the examination subject.

Exemplary positions that could lead to current loops are shown in FIG. 2. For example, the images shown in FIG. 2 could serve as reference images that are contained in the databank 18. These reference images then can be compared with acquired MR images in order to detect possible current loops. Various body parts of the patient touch in the regions shown encircled, so the current loops shown in FIG. 2 could result. The legs contact at their lower end in the position shown to the far left, such that a current loop formed by the legs, the contact point and the torso could result. In the left of the middle figures, a current loop could result due to the fact that the arms or the hands contact the body. In the right of the middle figures, a current loop results due to contacting of the arms, and in the figure shown at the right a current loop can result due to the fact that the legs contact at the inside of the knees. These and other possible positionings can be stored as reference images in the databank 18 and help in the detection of closed current loops, in that the acquired images are compared with the shown positions. If a possible current loop is detected, the contacting point can be marked with the laser pointer 20 in the MR system, operated by the laser controller 19 to mark the contact points of the various body parts. Furthermore, the operating personnel can be informed by the information unit 20 that a possible current loop was detected.

Steps are shown in FIG. 3 with which closed current loops can be detected. Images forming an overview MR image of the patient are acquired in a first step 31, with the entire body of the patient 13 inclusive of the extremities preferably being acquired since, as can be seen in FIG. 2, the current loops are primarily induced by the arrangements of the extremities.

The overview images acquired in step 31 are subsequently further processed in step 32 and are automatically electronically searched for geometric figures that could result in closed current loops in the examination subject. As mentioned before, a comparison can be conducted between the acquired MR image and the reference images. Other image processing methods can likewise be used; for example, free areas can be sought that are completely surrounded by at least one body part. Likewise, in the contours of the patient in the MR image it can be examined whether these contact the rest of the body. Any other image processing method can be used with which current loops can be detected.

In step 33 it is subsequently examined whether the positioning of the patient has occurred such that a current loop would result. If this is answered in the negative in step 33, the patient examination can be continued as desired and the MR images can be used with the image sequences that are necessary for the answer to the clinical question (step 34).

If a current loop is detected in the positioning of the patient in the acquired MR overview image, in a step 35 the operating personnel is informed that possible current loops could occur. The operating personnel then can react and reposition the patient. Optionally, in a step 36 the still-open point at which the current loop could close due to contact of various body parts can be marked with a laser. If the patient was repositioned, an overview image can be begun again in step 31.

In a further step, the position of the patient can be monitored further during the patient examination, with the MR images acquired during the rest of the examination likewise being automatically electronically searched for current loops (step 37). The formation of current loops is possible since the patient can have moved during the examination. If this is the case, the operating personnel can be informed as in the step 35. If no new possible current loops are detected, the examination can proceed (step 38).

In summary, the present invention increases patient safety since the creation of current loops can be detected in a reliable manner and steps can be taken to avoid or dismantle the loop. The workflow can be automated such that operating personnel no longer have to visually monitor the patient for this purpose.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance system comprising:
   an image acquisition unit adapted to interact with an examination subject to acquire a magnetic resonance image of the examination subject;
   an image processing unit supplied with said magnetic resonance image that automatically searches said image for geometric figures exhibited by the examination subject that could result in closed current loops in the examination subject;
   an information unit connected to said image processing unit that generates a humanly perceptible indication if and when a geometric figure that could lead to a closed current loop is detected in the magnetic resonance image by the image processing unit.

2. A magnetic resonance system as claimed in claim 1 comprising a data bank containing a plurality of electronically stored reference images of an examination subject, the reference images respectively exhibiting different positionings of the examination subject that could result in a closed current loop in the examination subject, said data bank being accessible by said image processing unit and said image processing unit comparing said magnetic resonance image with said reference images in said search for said geometric figures.

3. A magnetic resonance system as claimed in claim 1 comprising a patient table adapted to receive said examination subject thereon, and wherein said patient table is moved in steps or continuously through said image acquisition unit to acquire a plurality of magnetic resonance images, in combination forming an overview image of the body of the examination subject including extremities, and wherein said image processing unit uses said overview image for conducting said search for said geometric figures.

4. A magnetic resonance system as claimed in claim 1 comprising a light marking system, controlled by said processing unit dependent on said search for said geometric figures, that optically marks a point on the examination subject in the image acquisition unit at which a closed current loop could result.

5. A method for checking positioning of an examination subject in a magnetic resonant system, comprising the steps of:
   acquiring at least one magnetic resonance image of an examination subject in an image acquisition unit;
   in an image processing unit, automatically electronically searching said at least one magnetic resonance image for geometric figures in the examination subject that could result in closed current loops in the examination subject; and
   automatically generating a humanly perceptible indication if a geometric figure is detected in the search that could lead to a closed current loop.

6. A method as claimed in claim 5 comprising electronically storing a plurality of reference images, respectively exhibiting various positionings of an examination subject that could result in a closed current loop in the examination subject, and accessing said data bank by said image processing unit during said search, and comparing, in said image processing unit, said at least one magnetic resonance image with said reference images.

7. A method as claimed in claim 5 comprising conducting said searching in said image processing unit by searching for areas enclosed by the body of the examination subject.

8. A method as claimed in claim 5 comprising moving said examination subject in steps or continuously through said image acquisition unit and acquiring a plurality of magnetic resonance images that, in combination, form an overview image of the body of the examination subject including extremities, and searching said plurality of magnetic resonance images in said image processing unit for said geometric figures that could result in a closed current loop in the examination subject.

9. A method as claimed in claim 5 comprising conducting said searching in said image processing unit to identify a positioning of the examination subject at which extremities of the body of the examination subject contact each other.

10. A method as claimed in claim 5 comprising conducting said searching in said image processing unit to identify a positioning of the examination subject at which an extremity of the body of the examination subject contacts another region of the body of the examination subject.

11. A method as claimed in claim 5 comprising conducting said searching in said image processing unit to identify any location at the body of the examination subject, wherein a region of the body is separated from another region of the body by less than a predetermined distance.

12. A method as claimed in claim 11 comprising employing one cm as said predetermined distance in said search.

13. A method as claimed in claim 12 comprising selecting said planar slice image from the group consisting of transversal slice plane images, coronary slice plane images, and sagittal slice plane images.

14. A method as claimed in claim 5 comprising obtaining a planar slice image of said examination subject, as said MR image, and searching said planar slice image in said image processing unit for said geometric figures.

15. A method as claimed in claim 5 comprising providing said visually perceptible indication at a display screen of a monitor of said image acquisition unit.

16. A method as claimed in claim 5 comprising automatically optically marking a point on the body of the examination subject in the image acquisition unit, dependent on said search, at which a closed current loop could result.

17. A method as claimed in claim 5 comprising conducting a diagnostic magnetic resonance scan of the examination subject in the image acquisition unit and, in said medical diagnostic scan, acquiring a plurality of magnetic resonance diagnostic images, and searching at least some of said diagnostic magnetic images in said image processing unit for said geometric figures that could result in a closed current loop in the examination subject, to monitor movement of the examination subject during said diagnostic scan, and providing said humanly perceptible indication during said diagnostic scan if a geometric figure that could result in a closed current loop in the examination subject is detected in said search.

\* \* \* \* \*